United States Patent [19]
Miyamoto et al.

[11] Patent Number: 5,111,078
[45] Date of Patent: May 5, 1992

[54] INPUT CIRCUIT FOR LOGIC CIRCUIT HAVING NODE AND OPERATING METHOD THEREFOR

[75] Inventors: Hiroshi Miyamoto; Kazutoshi Hirayama, both of Hyogo, Japan

[73] Assignee: Mitsubishi Denki Kabushiki Kaisha, Tokyo, Japan

[21] Appl. No.: 758,704

[22] Filed: Sep. 9, 1991

Related U.S. Application Data

[63] Continuation of Ser. No. 479,662, Feb. 13, 1990, abandoned.

Foreign Application Priority Data

Feb. 15, 1989 [JP] Japan .................. 1-35409

[51] Int. Cl.⁵ ............... H03K 19/096; H03K 17/16
[52] U.S. Cl. .................... 307/451; 307/475; 307/279; 307/530; 307/481; 307/296.4
[58] Field of Search ............ 307/443, 448, 451, 475, 307/279, 530, 480–481, 296.4

[56] References Cited

U.S. PATENT DOCUMENTS

| | | | |
|---|---|---|---|
| 4,149,099 | 4/1979 | Nagami | 307/279 |
| 4,195,239 | 3/1980 | Suzuki | 307/279 |
| 4,561,702 | 12/1985 | McAdams | 307/475 |
| 4,733,112 | 3/1988 | Yamaguchi | 307/279 |

FOREIGN PATENT DOCUMENTS

| | | | |
|---|---|---|---|
| 0113192 | 9/1980 | Japan | 307/530 |
| 57-147193 | 9/1982 | Japan | |
| 59-23133 | 5/1989 | Japan | |

*Primary Examiner*—Stanley D. Miller
*Assistant Examiner*—Margaret R. Wambach
*Attorney, Agent, or Firm*—Lowe, Price, LeBlanc & Becker

[57] ABSTRACT

An address buffer circuit comprises a flip-flop circuit having first and second input nodes and connected between a power-supply potential and a ground potential. In addition, first, second and third transistors are connected in series in that order from the side of the ground between the first input node and the ground potential, to constitute a first input circuit, and fourth, fifth and sixth transistors are connected in series in that order from the side of the ground between the second input node and the ground potential, to constitute a second input circuit. An external address signal is applied to a control terminal of the first transistor, and a reference potential is applied to a control terminal of the fourth transistor. At the time of operating the address buffer circuit, the second and fifth transistors are first turned on, to bring the first and second input circuits into the operating state and then, to bring the flip-flop circuit into the operating state. Thereafter, the third and sixth transistors are turned off, to bring the first and second input circuits into the non-operating state.

29 Claims, 17 Drawing Sheets

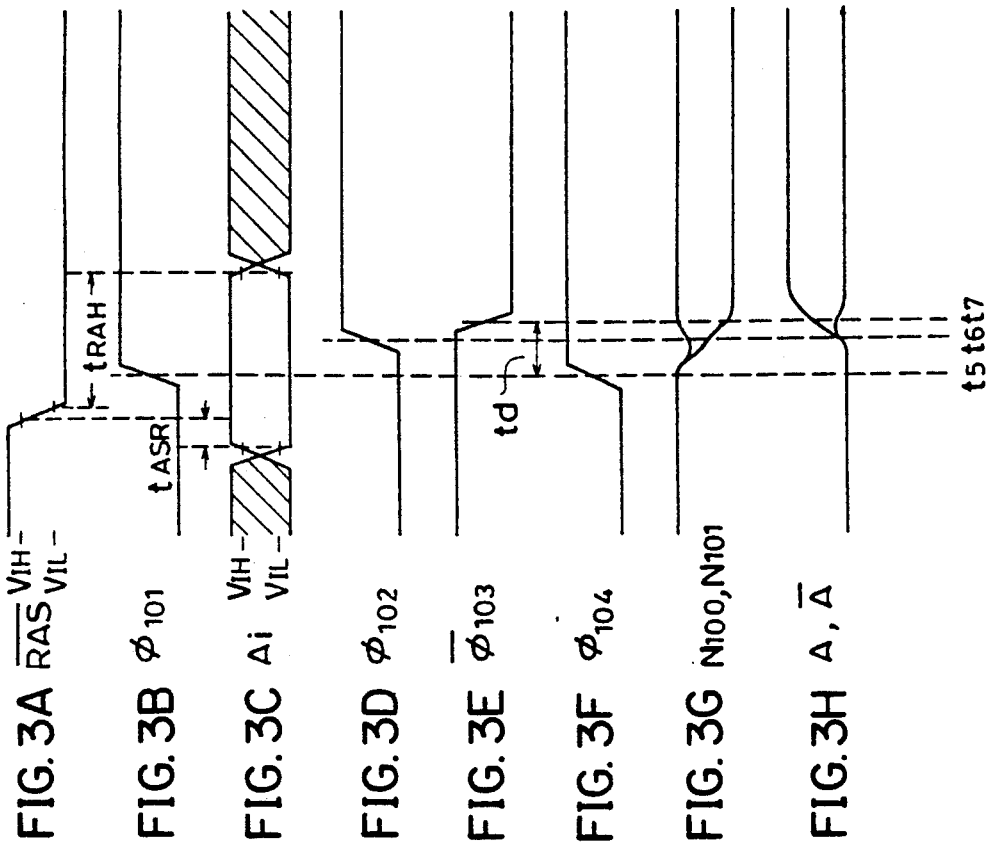
FIG. 3A $\overline{RAS}$
FIG. 3B $\phi_{101}$
FIG. 3C $A_i$
FIG. 3D $\phi_{102}$
FIG. 3E $\overline{\phi_{103}}$
FIG. 3F $\phi_{104}$
FIG. 3G $N_{100}, N_{101}$
FIG. 3H $A, \overline{A}$
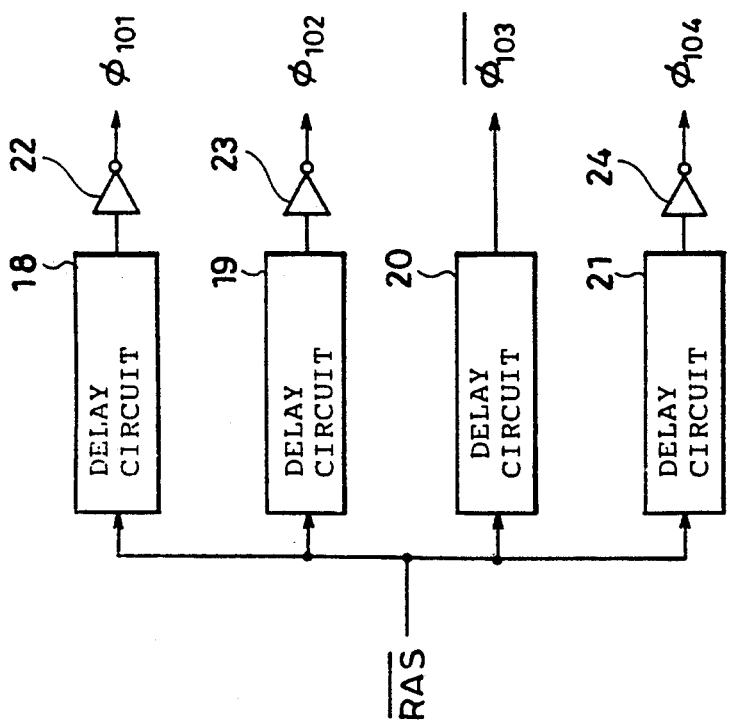
FIG. 2

FIG. 6A $\overline{RAS}$ 
FIG. 6B $\overline{\phi_{101a}}$ 
FIG. 6C $A_i$ 
FIG. 6D $\overline{\phi_{102a}}$ 
FIG. 6E $\phi_{103a}$ 
FIG. 6F $\overline{\phi_{104a}}$ 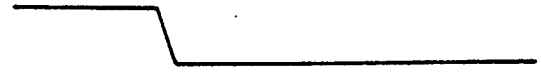
FIG. 6G $N_{100a}, N_{101a}$ 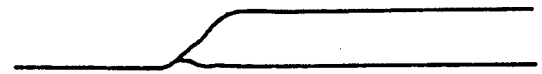
FIG. 6H $A, \overline{A}$ 

FIG. 8
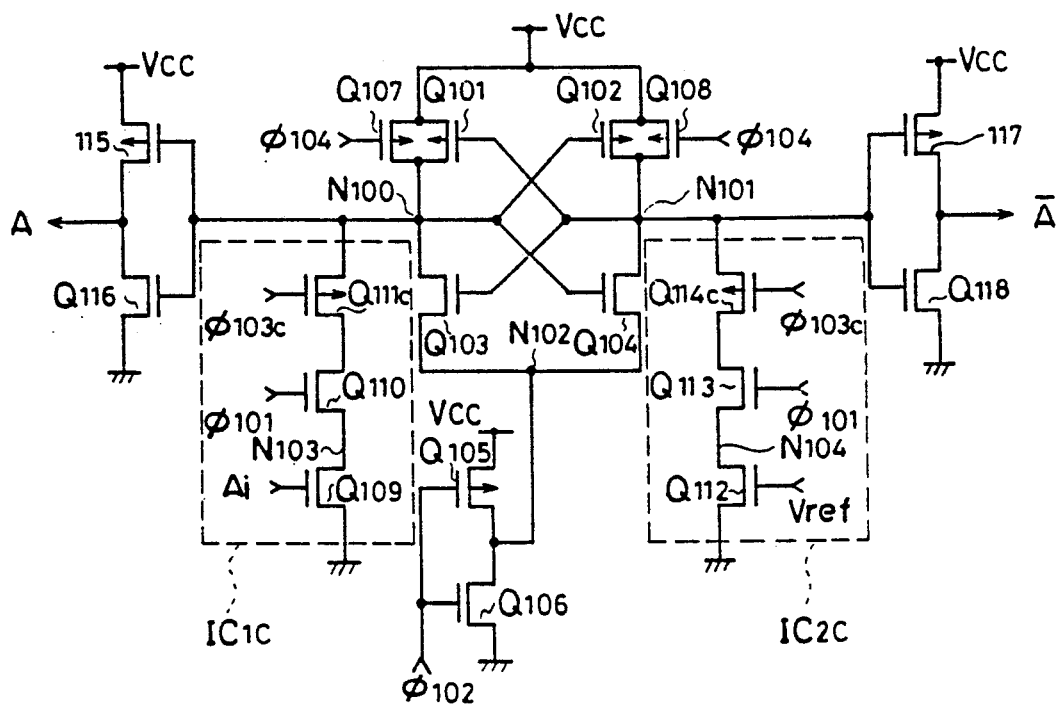
FIG. 9A $\overline{RAS}$
FIG. 9B $\phi 101$
FIG. 9C $Ai$
FIG. 9D $\phi 102$
FIG. 9E $\phi 103c$
FIG. 9F $\phi 104$ FIG.11
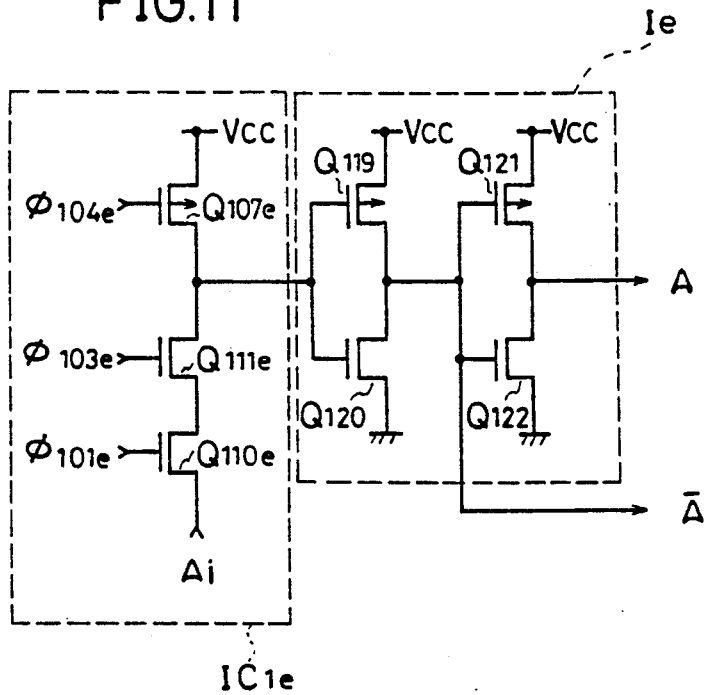
FIG. 12A $\overline{RAS}$
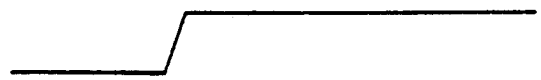
FIG. 12B $\phi_{101e}$
FIG. 12C $A_i$
FIG. 12D $\phi_{103e}$
FIG. 12E $\phi_{104e}$
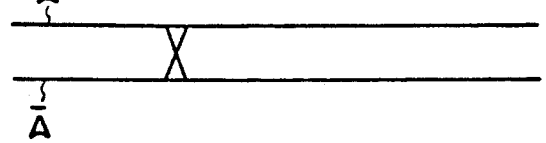
FIG. 12F $A, \overline{A}$

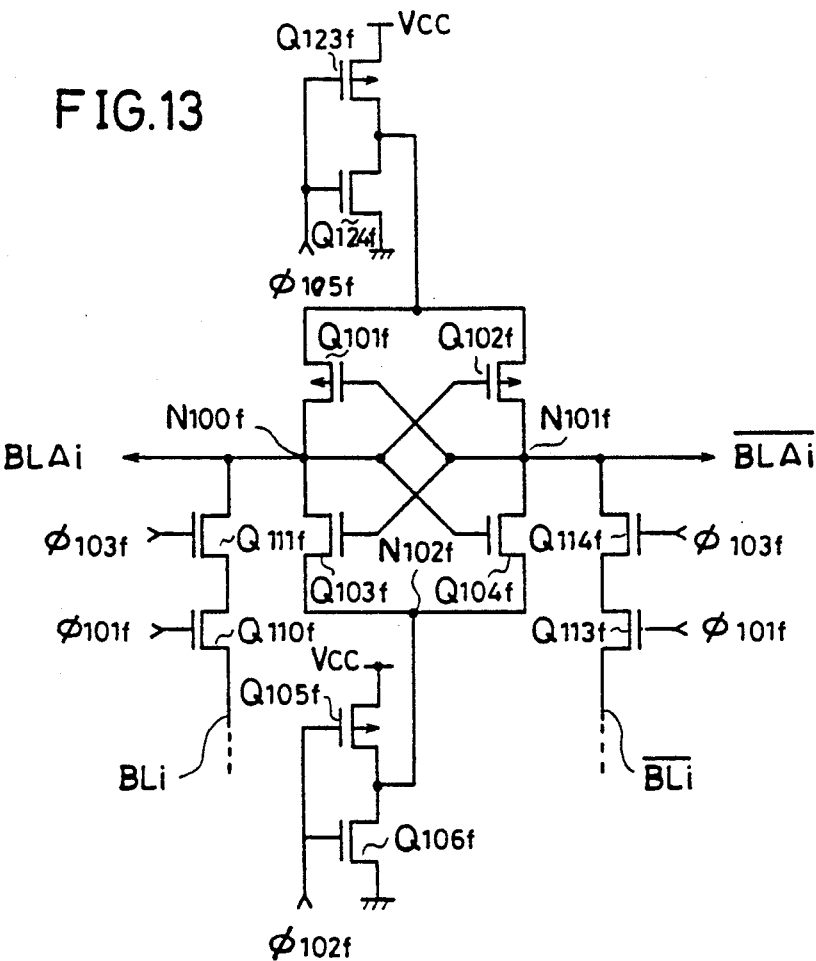
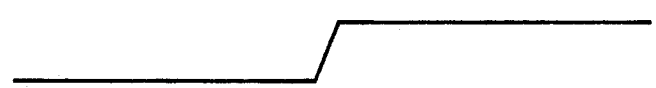
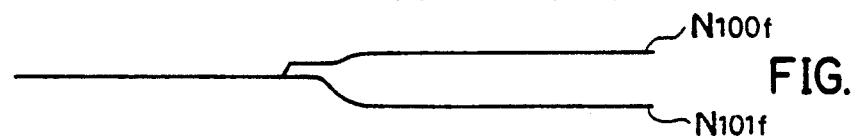

FIG. 16 PRIOR ART
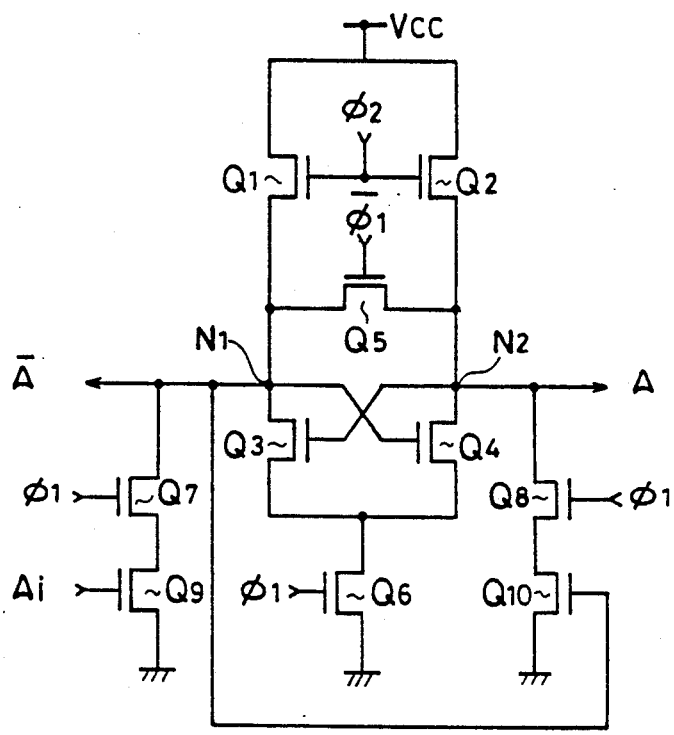
PRIOR ART
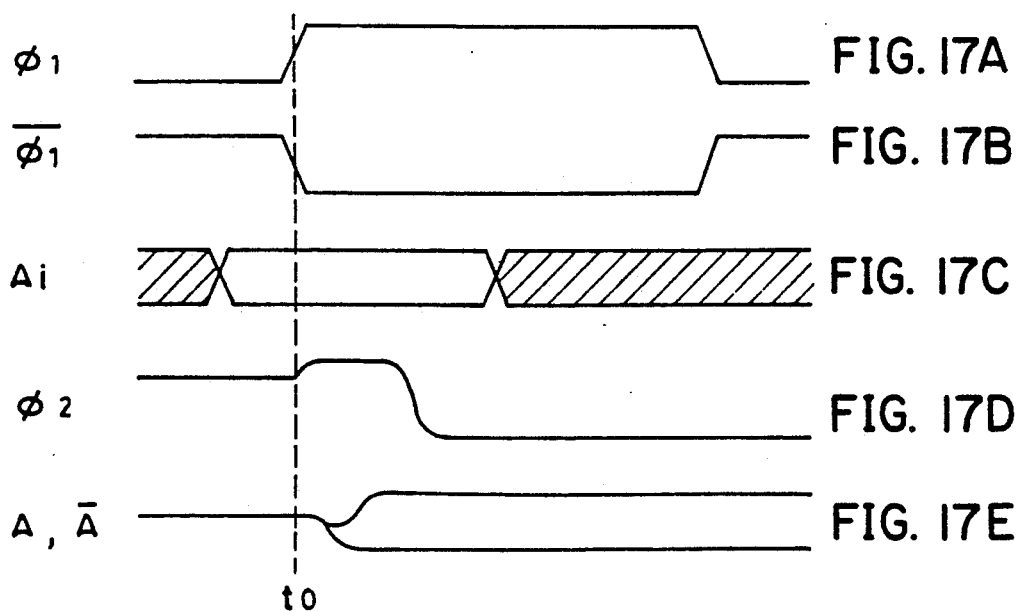

FIG. 18  PRIOR ART
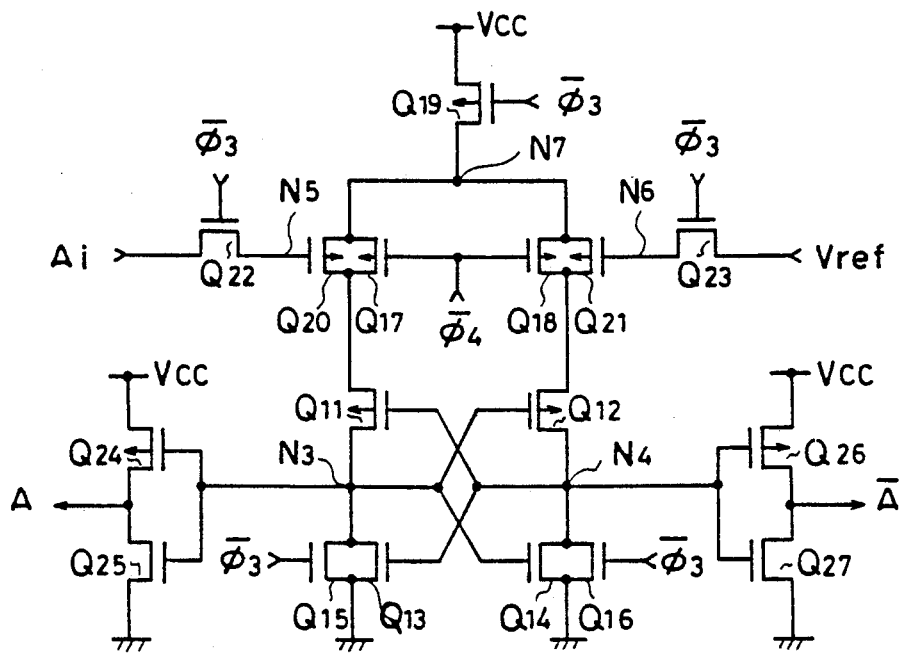
PRIOR ART
FIG. 21A  $\phi_3$ 
FIG. 21B  Ai 
FIG. 21C  N3, N4 
FIG. 21D  A, $\bar{A}$ 
FIG. 21E  $\bar{\phi_4}$ 

FIG.23 PRIOR ART
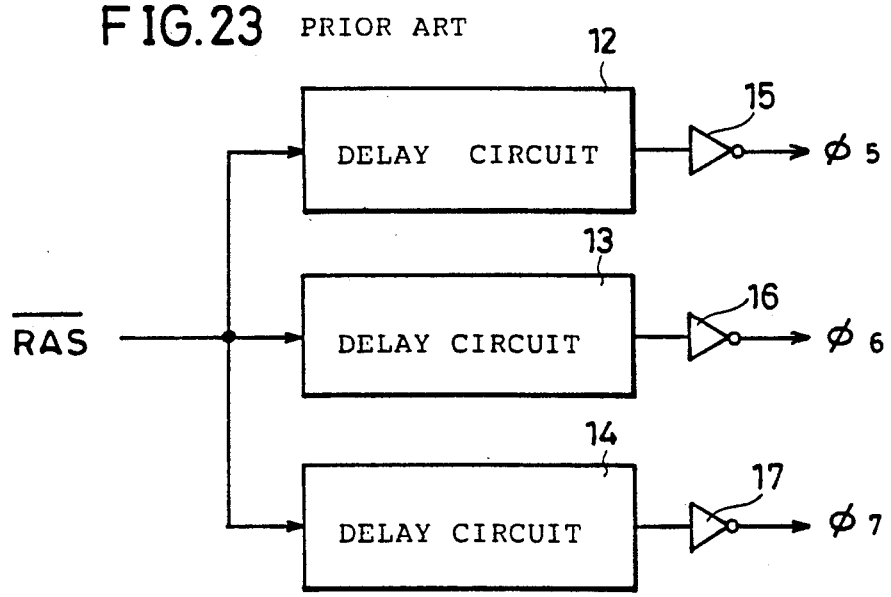
PRIOR ART
FIG. 24A $\phi_5$ 
FIG. 24B $A_i$ 
FIG. 24C $\phi_6$ 
FIG. 24D $N_8, N_9$ 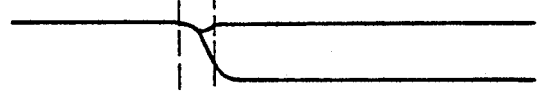
FIG. 24E $\phi_7$ 
FIG. 24F $A, \overline{A}$ 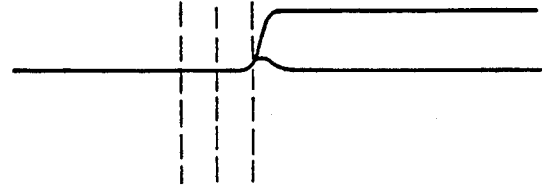

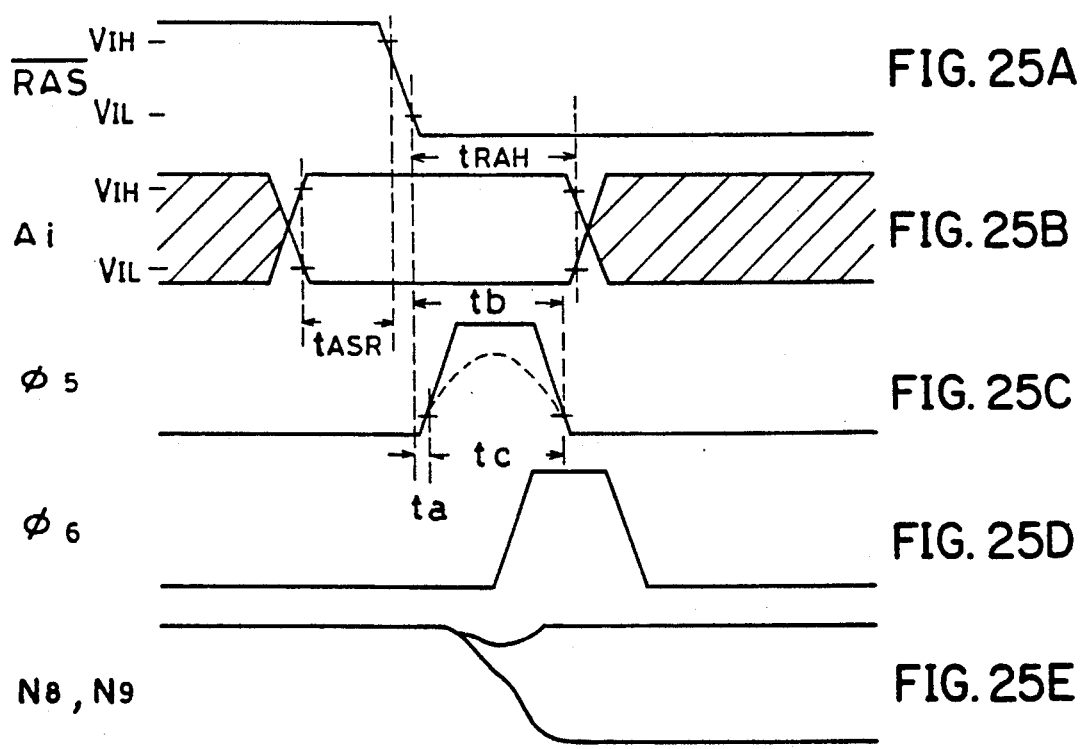

INPUT CIRCUIT FOR LOGIC CIRCUIT HAVING NODE AND OPERATING METHOD THEREFOR

This application is a continuation application of application Ser. No. 479,662, filed Feb. 13, 1990, now abandoned.

BACKGROUND OF THE INVENTION

1. Field of the Invention

The present invention relates generally to input circuits for logic circuits having nodes and an operating method therefor, and more particularly, to a circuit receiving an external signal for outputting true and complement signals, suitable for use as a buffer circuit such as an address buffer circuit and a data buffer circuit and as a sense amplifier, in a memory device such as a dynamic RAM (Random Access Memory) and an operating method therefor.

2. Description of the Background Art

FIG. 15 is a schematic block diagram showing a structure of a conventional dynamic RAM. In the dynamic RAM 100 shown in FIG. 15, a clock generator 1 generates various clock signals upon receipt of a row address strobe signal (referred to as $\overline{RAS}$ signal hereinafter), a column address strobe signal (referred to as $\overline{CAS}$ signal hereinafter) and a write enable signal (referred to as $\overline{WE}$ signal hereinafter), to apply the same to a column address buffer 2, a row address buffer 3, a data-in buffer 4 and a data-out buffer 5. On the other hand, externally applied address inputs $A_0, A_1, \ldots A_n$ for accessing a memory cell array 6 are applied to the column address buffer 2 and the row address buffer 3. More specifically, row address signals $A_0, A_1, \ldots A_n$ are accepted in the row address buffer 3 in response to the fall of the $\overline{RAS}$ signal and then, column address signals $A_0, A_1, \ldots A_n$ are accepted in the column address buffer 2 in response to the fall of the $\overline{CAS}$ signal. A word line (not shown) is then selected to be activated in a row decoder 7 in response to the row address signals held in the row address buffer 3. Thereafter, for example, in a reading operation, signals stored in memory cells connected to the activated word line are respectively read out to bit lines (not shown). The signals read out are amplified by a (sense amplifier and I/O control circuit) 8 and then, selected by a column decoder 9 in response to the column address signals held in the column address buffer 2, to be applied to the data-out buffer 5. The signals held in the data-out buffer 5 are outputted in response to the clock signals from the clock generator 1.

On the other hand, in a writing operation, an input data signal is written in the memory cell array 6 from the data-in buffer 4 through the I/O control circuit 8.

FIG. 16 is a circuit diagram showing an example of a conventional buffer circuit used as an address buffer circuit in a memory device such as the dynamic RAM shown in FIG. 15 and a static RAM, which is disclosed in, for example, Japanese Patent Publication No. 59-23133.

Description is now made of a structure of a buffer circuit shown in FIG. 16. Transistors used in the buffer circuit shown in FIG. 16 are all n channel MOS transistors. In FIG. 16, transistors $Q_1, Q_2, Q_3,$ and $Q_4$ constitute a flip-flop circuit. The transistors $Q_1$ and $Q_2$ functioning as load transistors of this flip-flop circuit have their gates receiving a clock $\phi_2$ from a clock source (not shown). In addition, input nodes N1 and N2 of the flip-flop circuit are connected to each other by a transistor $Q_5$ having its gate receiving a clock $\overline{\phi}_1$ from a clock source (not shown), address signals $\overline{A}$ and $A$ being extracted from the input nodes. This flip-flop circuit is driven by a transistor $Q_6$ having its gate receiving a clock $\phi_1$ from a clock source (not shown). On the other hand, the above described load transistors $Q_1$ and $Q_2$ are connected to a power-supply potential Vcc. Transistors $Q_7$ and $Q_9$ are connected in series between the node N1 and a ground potential. Transistors $Q_8$ and $Q_{10}$ are connected in series between the node N2 and the ground potential. The transistors $Q_7$ and $Q_8$ have their gates receiving the above described clock $\phi_1$, the transistor $Q_9$ has its gate receiving an external address signal $A_i$, and the transistor $Q_{10}$ has its gate connected to the node N1.

FIG. 17 is a timing chart for explaining an operation of the buffer circuit shown in FIG. 16. Referring now to FIG. 17, description is made of an operation of the conventional buffer circuit shown in FIG. 16.

First, before the time $t_0$, the clock $\phi_1$ is at the "L" level and the clocks $\overline{\phi}_1$ and $\phi_2$ are at the "H" level, so that the nodes N1 and N2 are precharged at the "H" level. The transistor $Q_5$ equalizes potentials of the nodes N1 and N2.

Then, at the time $t_0$, when the clock $\phi_1$ becomes the "H" level and the clock $\overline{\phi}_1$ becomes the "L" level, the transistors $Q_5$ is turned off so that equalizing of the potentials of the nodes N1 and N2 is stopped. At the same time, the transistors $Q_6, Q_7$ and $Q_8$ are turned on, so that a potential corresponding to the external address signal $A_i$ applied to the gate of the transistor $Q_9$ is transmitted to the flip-flop circuit.

For example, if the external address signal $A_i$ is at the "H" level, electric charges at the node N1 are discharged to the ground potential through the transistors $Q_7$ and $Q_9$, so that the node N1 becomes the "L" level, whereby the transistor $Q_{10}$ is turned off. As a result, charges at the node N2 are not discharged, so that the node N2 remains at the "H" level. Thus, the transistor $Q_4$ having its gate receiving the "L" level potential at the node N1 is turned off, and the transistor $Q_3$ having its gate receiving the "H" level potential at the node N2 is turned on. As a result, the address output signal A extracted from the node N2 becomes the "H" level, while the address output signal $\overline{A}$ extracted from the node N1 becomes the "L" level.

On the other hand, if the external address signal $A_i$ is at the "L" level, electric charges at the node N1 are not discharged, so that the node N1 remains at the "H" level. Thus, the transistor $Q_{10}$ having its gate receiving the "H" level potential at the node N1 is turned on. As a result, charges at the node N2 are discharged, so that the node N2 becomes the "L" level. Thus, the transistor $Q_4$ having its gate receiving the "H" level potential at the node N1 is turned on, and the transistor $Q_3$ having its gate receiving the "L" level potential at the node N2 is turned off. As a result, the address output signal A extracted from the node N2 becomes the "L" level, while the address output signal $\overline{A}$ extracted from the node N1 becomes the "H" level.

Meanwhile, the level of the clock $\phi_2$ is slightly increased by an amount corresponding to a threshold value $V_{TH}$ of an n channel MOS transistor after the time $t_0$ as shown in FIG. 17 in order to increase potentials at the nodes N1 and N2 to the potential Vcc quickly, by means of a well known bootstrapped signal generating circuit.

However, in the conventional buffer circuit shown in FIG. 16, a signal applied to the gates of the transistors $Q_7$ and $Q_8$ for switching and a signal applied to the transistor $Q_6$ for driving a flip-flop circuit are the same clock $\phi_1$. Thus, at the time $t_0$, when the clock $\phi_1$ becomes the "H" level, the transistors $Q_6$, $Q_7$ and $Q_8$ are simultaneously turned on. At this time, the transistors $Q_1$ and $Q_2$ are not turned off. Consequently, if the external address signal Ai is at the "H" level, electric charges of the node N1 are discharged through the transistors $Q_7$ and $Q_9$ while being charged from the power-supply potential Vcc through the transistor $Q_1$. As a result, discharging of the node N1 is delayed, and transient current unavoidably flows through the transistors $Q_1$, $Q_2$, $Q_3$, $Q_4$ and $Q_6$ from the power-supply potential Vcc to the ground potential, whereby power consumption in the buffer circuit is increased. Such undesirable transient current is referred to as penetrating current hereinafter. In addition, if discharging of the node N1 is delayed, the operating speed of the buffer circuit is reduced.

FIG. 18 is a circuit diagram showing another example of the conventional buffer circuit, which is disclosed in, for example, the U.S. Pat. No. 4,561,702. In addition, FIG. 19 is a block diagram showing a source of various clock signals used in the buffer circuit shown in FIG. 18, and FIG. 20 is a circuit diagram showing a source of a reference potential used in the buffer circuit shown in FIG. 18.

In FIG. 18, p channel transistors $Q_{11}$ and $Q_{12}$ and n channel transistors $Q_{13}$ and $Q_{14}$ constitute a CMOS flip-flop circuit. This flip-flop circuit is reset by n channel transistors $Q_{15}$ and $Q_{16}$ having their gates receiving a clock $\overline{\phi_3}$. The clock $\overline{\phi_3}$ is obtained by delayinq a $\overline{RAS}$ signal by a delay circuit 10, as shown in FIG. 19.

Additionally, this flip-flop circuit is connected to a power-supply potential Vcc through p channel transistors $Q_{17}$ and $Q_{18}$ having their gates receiving a clock $\overline{\phi_4}$ and a p channel transistor $Q_{19}$ having its gate receiving the clock $\overline{\phi_3}$. The clock $\overline{\phi_4}$ is obtained by delaying the $\overline{RAS}$ signal by a delay circuit 11, as shown in FIG. 19.

On the other hand, an external address signal Ai is applied to a gate of a p channel transistor $Q_{20}$ through an n channel transistor $Q_{22}$ having its gate receiving the clock $\overline{\phi_3}$, and a reference potential Vref is applied to a gate of a p channel transistor $Q_{21}$ through an n channel transistor $Q_{23}$ having its gate receiving the clock $\overline{\phi_3}$. A source of this reference potential Vref comprises a resistor having a high resistance value and three stages of PN diodes connected in series between the power-supply potential Vcc and a ground potential, as shown in FIG. 20, which supplies a reference potential Vref (approximately 1.6 V) which is approximately constant irrespective of fluctuations of the power-supply potential Vcc.

A node N3 is connected to gates of a p channel transistor $Q_{24}$ and an n channel transistor $Q_{25}$ connected in series between the power-supply potential Vcc and the ground potential, an address output signal A being extracted from a node of the transistors $Q_{24}$ and $Q_{25}$. In addition, a node N4 is connected to gates of a p channel transistor $Q_{26}$ and an n channel transistor $Q_{27}$ connected in series between the power-supply potential Vcc and the ground potential, an address output signal $\overline{A}$ being extracted from a node of the transistors $Q_{26}$ and $Q_{27}$.

FIG. 21 is a timing chart for explaining an operation of the buffer circuit shown in FIG. 18. Referring now to FIG. 21, description is made of an operation of the conventional buffer circuit shown in FIG. 18.

First, before the time $t_1$, the clock $\overline{\phi_3}$ is at the "H" level, so that the transistors $Q_{22}$ and $Q_{23}$ are on. Thus, the external address signal Ai is applied to the gate of the transist $Q_{20}$, and the reference potential Vref is applied to the gate of the transistor $Q_{21}$.

If the external address signal Ai is at a higher potential than the reference potential Vref, conductivity (current/voltage), i.e., conductance gm of the transistor $Q_{21}$ is larger than that of the transist $Q_{20}$. On the other hand, if the external address signal Ai is at a lower potential than the reference potential Vref, conductance gm of the transistor $Q_{21}$ is smaller than that of the transist $Q_{20}$. At this time, the transistors $Q_{15}$ and $Q_{16}$ are on, so that charges of the nodes N3 and N4 are both discharged to ground. Thus, the n channel transistor $Q_{14}$ receiving a potential of the node N3 and the n channel transistor $Q_{13}$ receiving a potential of the node N4 are both off.

Then, when the clock $\overline{\phi_3}$ becomes the "L" level at the time $t_1$, the transistors $Q_{22}$ and $Q_{23}$ are turned off, so that a potential of the external address signal Ai on this occasion is confined in the node N5 and the reference potential Vref is confined in the node N6. At the same time, the transistors $Q_{15}$ and $Q_{16}$ are turned off, so that resetting of the nodes N3 and N4 is stopped In addition, the transistor $Q_{19}$ is turned on, so that the power-supply potential Vcc for driving the flip-flop circuit is supplied to a node N7.

For example, if the potential of the external address signal Ai is higher than the reference potential Vref, the conductance gm of the transistor $Q_{21}$ is larger than that of the transistor $Q_{20}$. Thus, more current flows through the transistor $Q_{21}$, so that the potential of the node N4 is slightly higher than that of the node N3. A potential difference between the nodes N4 and N3 is amplified by the flip-flop circuit, so that the potential of the node N4 completely becomes the "H" level and the potential of the node N3 completely becomes the "L" level. As a result, the address output signal $\overline{A}$ extracted from the node N4 through an inverter becomes the "L" level, and the address output signal A extracted from the node N3 through an inverter becomes the "H" level. Meanwhile, the clock $\overline{\phi_4}$ applied to the gates of the transistors $Q_{17}$ and $Q_{18}$ becomes the "L" level after a lapse of a constant time period from the time $t_1$ in order to hold a potential of the flip-flop circuit.

However, in the conventional buffer circuit shown in FIG. 18, a common clock $\overline{\phi_3}$ is applied to the gates of the transistors $Q_{15}$ and $Q_{16}$ for resetting the nodes N3 and N4 which are output nodes of the flip-flop circuit to the ground potential and the gate of the transistor $Q_{19}$ for driving the flip-flop circuit. Consequently, when the clock $\phi_3$ becomes the "L" level at the time $t_1$, the flip-flop circuit is driven by the power supply potential Vcc through the transistor $Q_{19}$ irrespective of the fact that both the nodes N3 and N4 are at the ground potential and there is no potential difference between the nodes N3 and N4.

In general, since the external address signal Ai is supplied at a TTL level, a potential of 0.8 V or less and a potential of 2.4 V or more must be respectively distinguished as the "L" and "H" levels in the buffer circuit. The reference potential Vref is generally set to approximately 1.6 V which is intermediate between the potentials. For example, if the external address signal Ai is 2.4 V, the transistors $Q_{20}$ and $Q_{21}$ are not respectively turned off and on but they are both turned on, so that the conductance gm of the transistor $Q_{21}$ is slightly larger than that of the transistor $Q_{20}$. Thus, when the transistor $Q_{19}$ is turned on at the time $t_1$, a potential difference is small which is transmitted to the input nodes N3 and N4 of the flip-flop circuit from the power-supply potential Vcc through the transistors $Q_{20}$ and $Q_{21}$. Consequently, much time is required until the potential difference between the nodes N3 and N4 is amplified by the flip-flop circuit so that the transistors $Q_{11}$ and $Q_{14}$ are turned off and the transistors $Q_{12}$ and $Q_{13}$ are turned on whereby the nodes N3 and N4 respectively become the "L" and "H" levels after resetting of the flip-flop circuit is stopped at the time $t_1$. Thus, since penetrating current flows from the power-supply potential to the ground potential from the time $t_1$ to the time when the transistors $Q_{11}$ and $Q_{14}$ are turned off, power consumption in the buffer circuit is increased. In addition, since much time is required until the address output signals A and $\overline{A}$ are outputted, the operating speed of the buffer circuit is reduced.

FIG. 22 is a circuit diagram showing one example of a conventional buffer circuit proposed to solve such problems. In addition, FIG. 23 is a block diagram showing a source of various clock signals used in the buffer circuit shown in FIG. 22.

In FIG. 22, transistors used in this buffer circuit are all n channel MOS transistors. Depletion type transistors $Q_{28}$ and $Q_{29}$ and enhancement type transistors $Q_{30}$ and $Q_{31}$ constitute a first flip-flop circuit. This first flip-flop circuit is driven by a transistor $Q_{32}$ having its gate receiving a clock $\phi_6$. The clock $\phi_6$ is obtained by delaying a $\overline{RAS}$ signal by a delay circuit 13 and inverting the same by an inverter 16, as shown in FIG. 23.

On the other hand, transistors $Q_{33}$ and $Q_{35}$ are connected in series between a node N8 and a ground potential, and transistors $Q_{34}$ and $Q_{36}$ are connected in series between a node N9 and the ground potential. An external address signal Ai is applied to a gate of the transistor $Q_{33}$, and a reference potential Vref generated in the circuit shown in FIG. 20 is connected to a gate of the transistor $Q_{34}$. In addition, the transistors $Q_{35}$ and $Q_{36}$ have their gates receiving a common clock $\phi_5$. This clock $\phi_5$ is obtained by delaying a $\overline{RAS}$ signal by a delay circuit 12 and inverting the same by an inverter 15, as shown in FIG. 23.

Additionally, transistors $Q_{39}$, $Q_{40}$, $Q_{41}$ and $Q_{42}$ constitute a second flip-flop circuit. The nodes N8 and N9 are respectively connected to gates of the transistors $Q_{39}$ and $Q_{40}$ through the transistors $Q_{37}$ and $Q_{38}$. This second flip-flop circuit is driven by a clock $\phi_7$. The clock $\phi_7$ is obtained by delaying the $\overline{RAS}$ signal by a delay circuit 14 and inverting the same by an inverter 17, as shown in FIG. 23. Address output signals $\overline{A}$ and A are respectively extracted from nodes N10 and N11 of this second flip-flop circuit.

FIG. 24 is a timing chart for explaining an operation of the buffer circuit shown in FIG. 22. Referring now to FIG. 24, description is made of the conventional buffer circuit shown in FIG. 22.

First, before the time $t_2$, both the clocks $\phi_5$ and $\phi_6$ are at the "L" level, and the nodes N8 and N9 are respectively precharged at a power-supply potential Vcc through depletion type transistors $Q_{28}$ and $Q_{29}$. Then, when the clock $\phi_5$ becomes the "H" level at the time $t_2$, the level of the external address signal Ai is transmitted to the first flip-flop circuit.

More specifically, when the external address signal Ai is at the "H" level, charges at the node N8 are discharged through the transistors $Q_{33}$ and $Q_{35}$, and charges at the node N9 are discharged through the transistors $Q_{34}$ and $Q_{36}$. On this occasion, since conductance gm of the n channel transistor $Q_{33}$ is larger than that of the n channel transistor $Q_{34}$, more current flows through the transistor $Q_{33}$, so that a potential of the node N8 is lower than that of the node N9. By the above described operation, a potential difference is produced between the input nodes N8 and N9 of the first flip-flop circuit. Thereafter, at the time $t_3$, the clock $\phi_6$ becomes the "H" level so that the transistor $Q_{32}$ is turned on, whereby the potential difference between the nodes N8 and N9 is amplified by the first flip-flop circuit.

Additionally, the potentials of the nodes N8 and N9 are respectively transmitted to the gates of the transistors $Q_{39}$ and $Q_{40}$ of the second flip-flop circuit through the transistors $Q_{37}$ and $Q_{38}$. Then, at the time $t_4$, the clock $\phi_7$ becomes the "H" level, whereby the "L" level address output signal $\overline{A}$ and the "H" level address output signal A are respectively extracted from the nodes N10 and N11.

In this buffer circuit shown in FIG. 22, which is different from the above described buffer circuits shown in FIGS. 16 and 18, the potential difference has been already produced between the input nodes N8 and N9 of the first flip-flop circuit at the time point when the clock $\phi_6$ becomes the "H" level at the time $t_3$ so that the first flip-flop circuit is driven. Thus, penetrating current through the flip-flop circuit is decreased and time required until the address output signals are outputted is shortened. Such an address buffer circuit using different clocks as a driving signal for a flip-flop and an address control signal is disclosed in, for example, Japanese Patent Laying-Open Gazette No. 147193/1982.

However, the buffer circuit shown in FIG. 22 has the following problems. FIG. 25 is a diagram showing specifically a part of the timing chart of FIG. 24. Description is now made of a case in which the buffer circuit shown in FIG. 22 is used as a row address buffer of the dynamic RAM.

As shown in FIG. 25, two constraints, i.e., row address set up time (referred to as $t_{ASR}$ hereinafter) and row address hold time (referred to as $t_{RAH}$ hereinafter) are established between the $\overline{RAS}$ signal and the external address signal Ai. More specifically, the effective external address signal Ai must be set before the time point of the fall of the $\overline{RAS}$ signal by $t_{ASR}$ and must not be reset until after the time point of the fall of $\overline{RAS}$ signal by $t_{RAH}$. For example, it is provided that $t_{ASR}$ is 0ns and $t_{RAH}$ is approximately 10 to 15 ns. On the other hand, in the buffer circuit shown in FIG. 22, the external address signal Ai starts to be transmitted to the buffer circuit in response to the clock $\phi_5$ which becomes the "H" level by sensing that the $\overline{RAS}$ signal becomes the "L" level. Thus, if time ta from the time when the $\overline{RAS}$ signal becomes the "L" level to the time when the clock $\phi_5$ becomes the "H" level is long, $t_{ASR}$ may be short, i.e., take a negative value, so that a margin relative to the constraint of $t_{ASR}$ (for example, 0ns) becomes large. In other words, since the external address signal Ai is loaded into the buffer circuit only after the signal $\phi_5$ becomes the "H" level, the rise of the signal Ai to the "H" level is permitted to be delayed if the time ta is long. As a result, the time period required for the signal Ai to be set before the fall of the $\overline{RAS}$ signal, that is, $t_{ASR}$ is permitted to be negative value. On the other hand, the clock $\phi_5$ becomes the "L" level again after a lapse of the time tc since it became the "H" level for the purpose of preventing the current from flowing through the transistors $Q_{35}$ and $Q_{33}$ from the node N8 and preventing effect exerted by the change in the external address signal from being transmitted to the flip-flop circuit. Thus, the shorter time tb from the time when the $\overline{RAS}$ signal becomes the "L" level to the time when the clock $\phi_5$ becomes the "L" level again, the shorter $t_{RAH}$ may be, so that a margin relative to the regulation of $t_{RAH}$ becomes large. More specifically, the shorter time tc when the clock $\phi_5$ is at the "H" level, the larger the margins with respect to the constraints of $t_{ASR}$ and $t_{RAH}$ become. In order to ensure such satisfactory margins, the pulse duration of the "H" level clock $\phi_5$ must be short, i.e., 10 ns or less.

However, in an LSI (large-scale integrated circuit) such as a dynamic RAM, a signal having a single and short pulse duration has a dull waveform as represented by a broken line in the clock $\phi_5$ shown in FIG. 25 due to internal resistance of a signal driving circuit and resistance and stray capacitance of a signal interconnection, so that a potential of an "H" level portion is not substantially increased. Consequently, the conductance gm of the transistors $Q_{33}$ and $Q_{34}$ are not substantially increased, so that much time is required to discharge charges of the nodes N8 or N9. Thus, an operation of the flip-flop circuit is eventually delayed so that output of the address output signals is delayed.

Conversely, if the pulse duration of the clock $\phi_5$ is long so that the potential of the "H" level portion is sufficiently increased, the operation of the buffer circuit is delayed.

As described in the foregoing, in the conventional buffer circuit shown in FIGS. 16 and 18, a signal for transmitting an external address signal to a flip-flop circuit and a signal for driving the flip-flop circuit are the same, so that little potential difference is produced at input nodes of the flip-flop circuit at the time of driving the flip-flop circuit. As a result, an operation of the flip-flop circuit is delayed so that penetrating current flows therethrough, and much time is required to output address output signals.

Additionally, in the buffer circuit shown FIG. 22, a signal for transmitting an external address signal to a flip-flop circuit and a signal for driving the flip-flop circuit are different from each other. Even in such a case, if there is only a single switching transistor for controlling transmission of the external address signal to the flip-flop circuit, an independent clock having a short pulse duration is required to control this transistor. However, a potential corresponding to the external address signal is not considerably transmitted due to dullness of the waveform. As a result, an operation of the flip-flop circuit is delayed and much time is required until address output signals are outputted.

SUMMARY OF THE INVENTION

Therefore, an object of the present invention is to provide an input circuit for a logic circuit in which penetrating current through the logic circuit, i.e, consumed current thereof is reduced.

Another object of the present invention is to provide a buffer circuit having a fast operating speed and requiring little time to output an address signal.

Still another object of the present invention is to provide a buffer circuit capable of ensuring large margins relative to address set up time and address hold time when it is used as an address buffer circuit.

Briefly stated, according to the present invention, the first input circuit receiving the external signal is provided between the first input node of the logic circuit and the first potential and the second input circuit receiving the reference potential is provided between the second input node and the first potential, and the logic circuit means is driven by the first clock, the first and second input circuits are brought into the operating state by the second clock and the first and second input circuits are brought into the non-operating state by the third clock so that a potential difference is produced at the input nodes of the logic circuit at the time of initiating an operation of the flip-flop circuit.

Therefore, a principal advantage of the present invention is that penetrating current through the logic circuit can be reduced and a high-speed operation can be achieved.

Additionally, another advantage of the present invention is that since the operating state and the non-operating state of the first and second input circuits are controlled by different clocks, satisfactory margins can be provided for address set up time and address hold time if this buffer circuit is used as an address buffer circuit.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a block diagram showing a source of various clock signals used in the buffer circuit shown in FIG. 1;

FIGS. 3A-H are timing charts for explaining an operation of the buffer circuit shown in FIG. 1;

FIGS. 6A-H are timing charts for explaining an operation of the buffer circuit shown in FIG. 5;

FIG. 8 is a circuit diagram showing a buffer circuit according to the fifth embodiment of the present invention;

FIGS. 9A-F are timing charts for explaining an operation of the buffer circuit shown in FIG. 8;

FIG. 11 is a circuit diagram showing a buffer circuit according to the seventh embodiment of the present invention;

FIGS. 12A-F are timing charts for explaining an operation of the buffer circuit shown in FIG. 11;

FIG. 13 is a circuit diagram showing a sense amplifier according to the eighth embodiment of the present invention;

FIGS. 14A-F are timing chart for explaining an operation of the sense amplifier shown in FIG. 13;

FIG. 16 is a circuit diagram showing one example of a conventional buffer circuit;

FIGS. 17 A-E are timing charts for explaining an operation of the buffer circuit shown in FIG. 16;

FIG. 18 is a circuit diagram showing another example of the conventional buffer circuit;

FIGS. 21 A-E are timing charts for explaining an operation of the buffer circuit shown in FIG. 18;

FIG. 23 is a block diagram showing a source of various clock signals used in the buffer circuit shown in FIG. 22;

FIGS. 24 A-F are timing charts for explaining an operation of the buffer circuit shown in FIG. 22; and FIGS. 25 A-E are diagrams showing specifically a part of the timing chart of FIG. 24.

DESCRIPTION OF THE PREFERRED EMBODIMENTS

Figure 1:
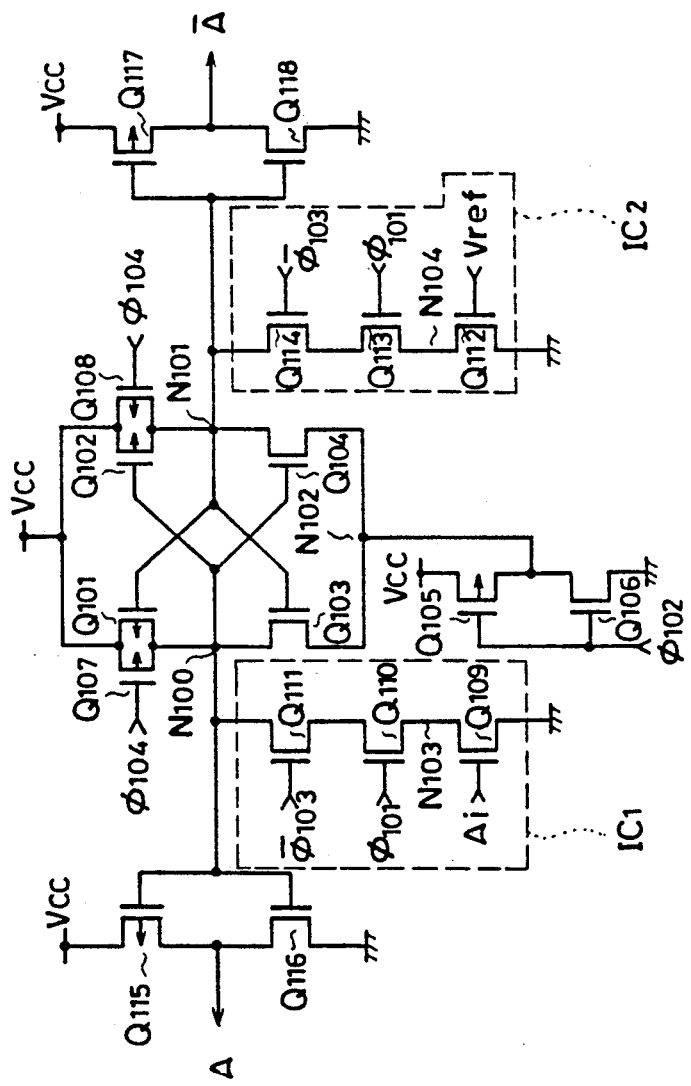
FIG. 1 is a circuit diagram showing a buffer circuit according to the first embodiment of the present invention.
Figure 15:
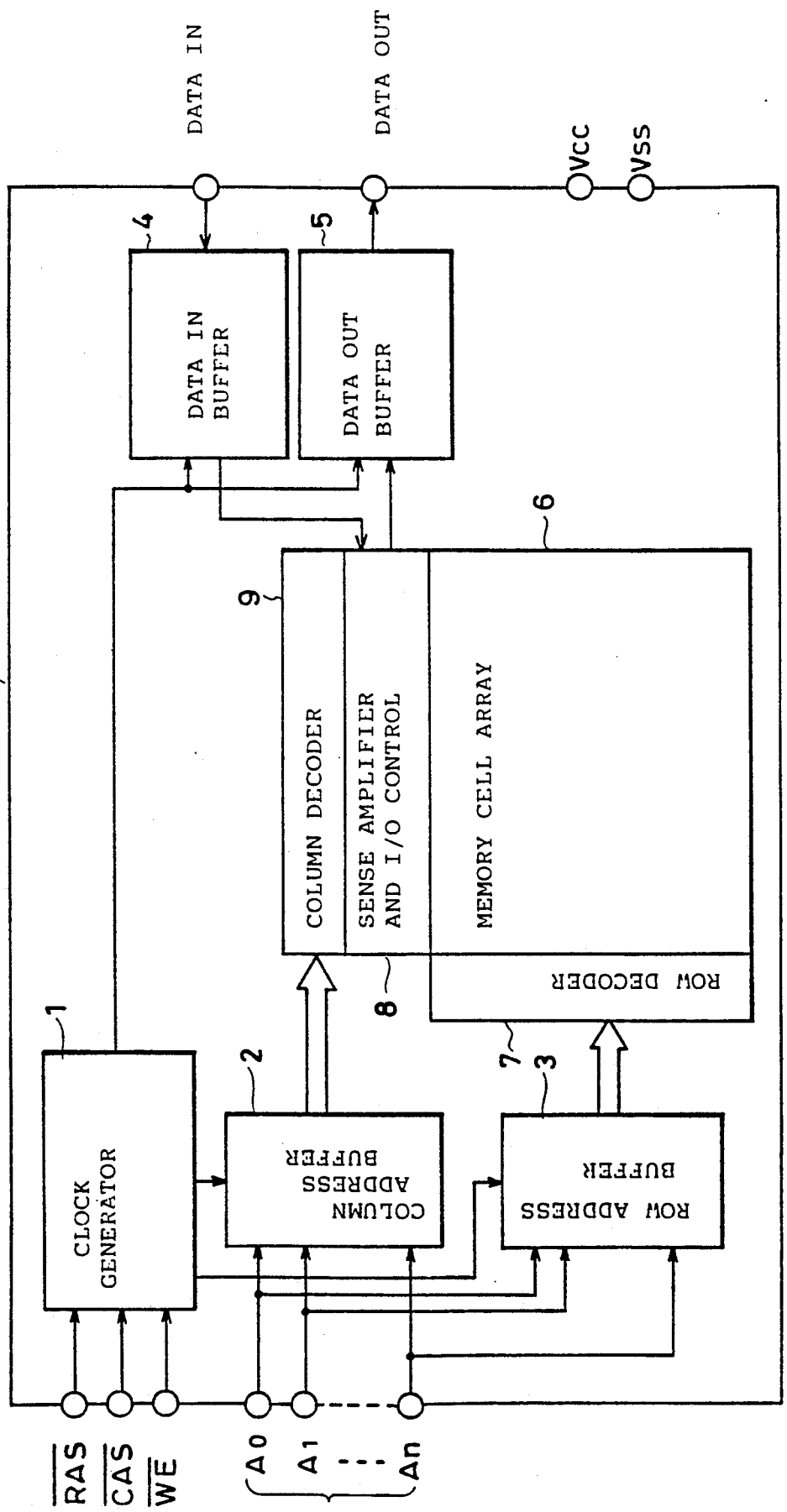
FIG. 15 is a schematic block diagram showing a structure of a dynamic RAM.
Figure 19:
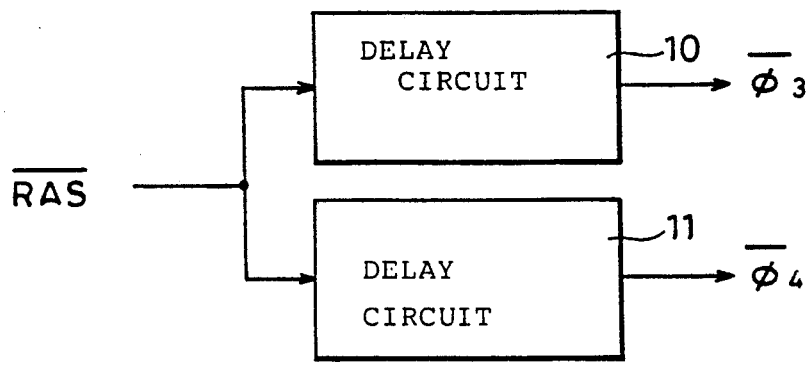
FIG. 19 is a block diagram showing a source of various clock signals used in the buffer circuit shown in FIG. 18.

FIG. 1 is a circuit diagram showing a buffer circuit according to the first embodiment of the present invention, which is used as an address buffer circuit in the memory device shown in FIG. 15. In addition, FIG. 2 is a block diagram showing a source of various clock signals used in the buffer circuit shown in FIG. 1.

Description is now made of a structure of the buffer circuit shown in FIG. 1. In FIG. 1, p channel transistors $Q_{101}$ and $Q_{102}$ and n channel transistors $Q_{103}$ and $Q_{104}$ constitute a flip-flop circuit. This flip-flop circuit is driven by a clock $\phi_{102}$ through an inverter comprising a p channel transistor $Q_{105}$ and an n channel transistor $Q_{106}$. This clock $\phi_{102}$ is obtained by delaying a $\overline{RAS}$ signal by a delay circuit 19 and inverting the same by an inverter 23, as shown in FIG. 2. Input nodes $N_{100}$ and $N_{101}$ of this flip-flop circuit are precharged by p channel transistors $Q_{107}$ and $Q_{108}$ having their gates receiving a clock $\phi_{104}$. This clock $\phi_{104}$ is obtained by delaying the $\overline{RAS}$ signal by a delay circuit 21 and inverting the same by an inverter 24, as shown in FIG. 2.

Figure 20:
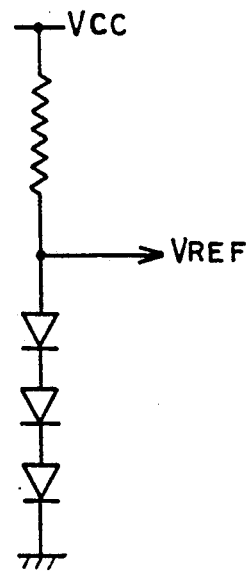
FIG. 20 is a circuit diagram showing a source of a reference potential used in the buffer circuit shown in FIG. 18.
Figure 22:
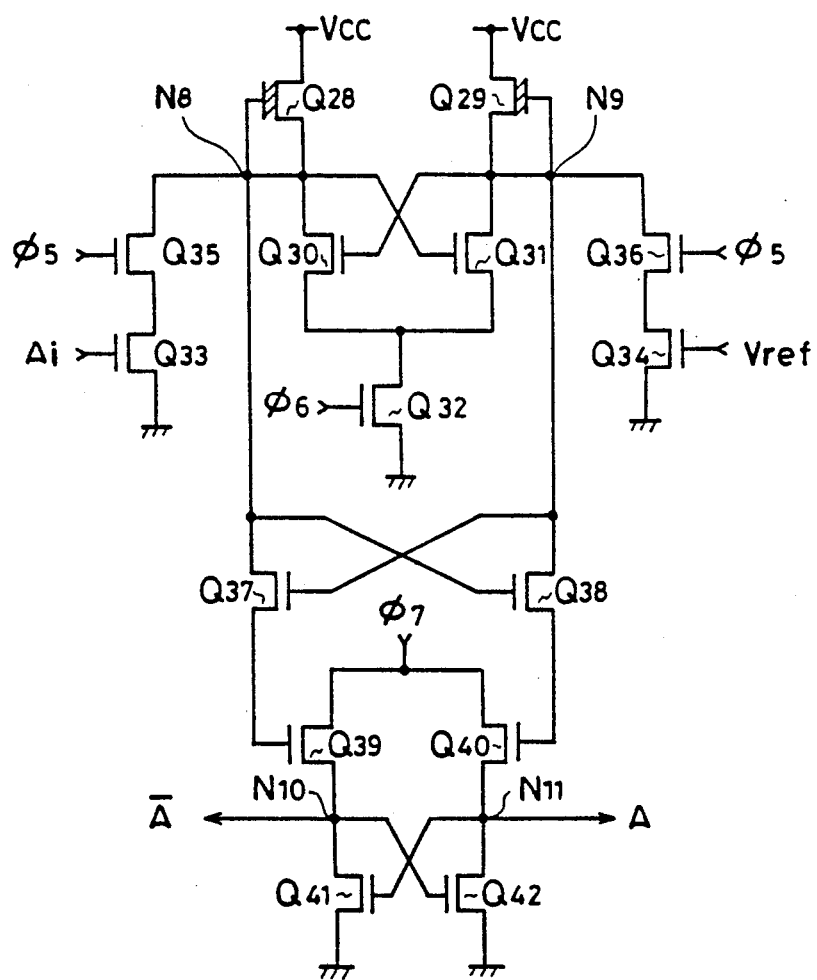
FIG. 22 is a circuit diagram showing another example of the conventional buffer circuit.

On the other hand, an input circuit $IC_1$ comprising n channel transistors $Q_{109}$, $Q_{110}$ and $Q_{111}$ connected in series is connected between one input node $N_{100}$ of the flip-flop circuit and a ground potential, and an input circuit $IC_2$ comprising n channel transistors $Q_{112}$, $Q_{113}$ and $Q_{114}$ connected in series is connected between the node $N_{101}$ and the ground potential. An external address signal Ai is applied to a gate of the transistor $Q_{109}$, and a reference potential Vref generated in the circuit shown in FIG. 20 is applied to a gate of the transistor $Q_{112}$. The transistors $Q_{110}$ and $Q_{113}$ have their gates receiving a clock $\phi_{101}$, and the transistors $Q_{111}$ and $Q_{114}$ have their gates receiving a clock $\overline{\phi}_{103}$. This clock $\phi_{101}$ is obtained by delaying the $\overline{RAS}$ signal by a delay circuit 18 and inverting the same by an inverter 22, and the clock $\overline{\phi}_{103}$ is obtained by delaying the $\overline{RAS}$ signal by a delay circuit 20, as show in FIG. 2.

An inverter comprising a p channel transistor $Q_{115}$ and an n channel transistor $Q_{116}$ is further connected to the node $N_{100}$ of the above described flip-flop circuit, an output of this inverter being extracted as an address output signal A. On the other hand, an inverter comprising a p channel transistor $Q_{117}$ and an n channel transistor $Q_{118}$ are further connected to the node $N_{101}$ of the flip-flop circuit, an output of this inverter being extracted as an address output signal $\overline{A}$.

FIG. 3 is a timing chart for explaining an operation of the buffer circuit shown in FIG. 1. Referring now to FIG. 3, description is made of the buffer circuit according to an embodiment of the present invention as shown in FIG. 1.

First, before time $t_5$, the clocks $\phi_{101}$, $\phi_{102}$ and $\phi_{104}$ are at the "L" level and the clock $\overline{\phi}_{103}$ is at the "H" level. Thus, the transistors $Q_{110}$ and $Q_{113}$ are turned off and the transistors $Q_{111}$ and $Q_{114}$ are turned on, so that the input nodes $N_{100}$ and $N_{101}$ of the flip-flop circuit are respectively precharged at the "H" level by the transistors $Q_{107}$ and $Q_{108}$ and a node N102 thereof is further precharged at the "H" level.

Then, when the clocks $\phi_{101}$ and $\phi_{104}$ become the "H" level at the time $t_5$, the transistors $Q_{107}$ and $Q_{108}$ are turned off, so that precharging of the nodes $N_{100}$ and $N_{101}$ is stopped. In addition, the transistors $Q_{110}$ and $Q_{113}$ are turned on so that a potential difference corresponding to the level of the external address signal Ai is produced between the nodes $N_{100}$ and $N_{101}$. The external address signal Ai is generally at a TTL level. That is, an "H" level potential thereof is 2.4 V and an "L" level potential thereof is 0.8 V. Thus, the reference potential Vref is generally set to 1.6 V which is intermediate between the "H" and "L" level potentials thereof. If the external address signal Ai is at, for example, the "H" level, conductance gm of the transistor $Q_{109}$ is larger than that of the transistor $Q_{112}$, so that more current flows through the transistor $Q_{109}$. Consequently, a potential of the node $N_{100}$ is lower than that of the node $N_{101}$, so that a potential difference is produced between the nodes $N_{100}$ and $N_{101}$.

Then, when the clock $\phi_{102}$ becomes the "H" level at the time $t_6$, the flip-flop circuit is driven, so that the potential difference between the nodes $N_{100}$ and $N_{101}$ is amplified. More specifically, the flip-flop circuit is driven after the potential difference is produced between the input nodes $N_{100}$ and $N_{101}$ of the flip-flop circuit as described above, so that penetrating current through the flip-flop circuit is decreased and the speed of amplification of the potential difference between the nodes $N_{100}$ and $N_{101}$ is increased.

Then, when the clock $\overline{\phi}_{103}$ becomes the "L" level at the time $t_7$, the transistors $Q_{111}$ and $Q_{114}$ are turned off, so that the change of the external address signal Ai after the time $t_7$ is not accepted. In addition, the potential difference between the nodes $N_{100}$ and $N_{101}$ is further amplified so that the node $N_{101}$ becomes the "H" level. However, since the transistor $Q_{114}$ is turned off as described above, no current flows from the node $N_{101}$ to the ground potential.

If and when the buffer circuit shown in FIG. 1 is employed as, for example, a row address buffer of the dynamic RAM, the clock $\phi_{101}$ becomes the "H" level so that the transistor $Q_{110}$ is turned on, whereby the input circuit $IC_1$ enters the operating state. Thus, set up time $t_{ASR}$ of the external address signal Ai relative to the $\overline{RAS}$ signal is determined based on the timing at which the clock $\phi_{101}$ becomes the "H" level. This clock $\phi_{101}$ is obtained by delaying the $\overline{RAS}$ signal by the delay circuit 18 and then, inverting the same by the inverter 22, as shown in FIG. 2. Thus, timing at which the clock $\phi_{101}$ rises to the "H" level can be set so as to provide a margin for the regulation of the set up time $t_{ASR}$ by suitably adjusting delay time of the delay circuit 18.

On the other hand, when the clock $\overline{\phi}_{103}$ becomes the "L" level, the transistor $Q_{111}$ is turned off, so that the input circuit $IC_1$ enters the non-operating state. Thus, even if the external address signal Ai is changed thereafter, the change is not accepted. More specifically, hold time $t_{RAH}$ of the external address signal Ai relative to the $\overline{RAS}$ signal is determined based on the timing at which the clock $\overline{\phi}_{103}$ becomes the "L" level. This clock $\overline{\phi}_{103}$ is generated independently of the above described clock $\phi_{101}$ by delaying the $\overline{RAS}$ signal by the delay circuit 20 as shown in FIG. 2. Thus, even if timing t7 at which the clock $\overline{\phi}_{103}$ becomes the "L" level is made fast, the potentials of the nodes $N_{103}$ and $N_{104}$ are easily transmitted to the input nodes $N_{100}$ and $N_{101}$ of the flip-flop circuit, unlike the conventional example described with reference to FIG. 25. Therefore, the hold time $t_{RAH}$ can be shortened and a margin with respect to the constraint of the hold time $t_{RAH}$ can be increased.

As described in the foregoing, in the buffer circuit according to an embodiment of the present invention as shown in FIG. 1, the potentials of the nodes $N_{103}$ and $N_{104}$ are considerably transmitted to the input nodes $N_{100}$ and $N_{101}$ of the flip-flop circuit. Thus, a considerable potential difference is produced between the nodes $N_{100}$ and $N_{101}$, so that the operating speed of the flip-flop circuit is increased. As a result, the address output signals A and $\overline{A}$ can be obtained faster.

Although in the buffer circuit shown in FIG. 1, description was made of a case in which the clocks $\phi_{101}$ and $\phi_{104}$ simultaneously become the "H" level, they may become the "H" level at different timing, to obtain the same effect.

Figure 4:
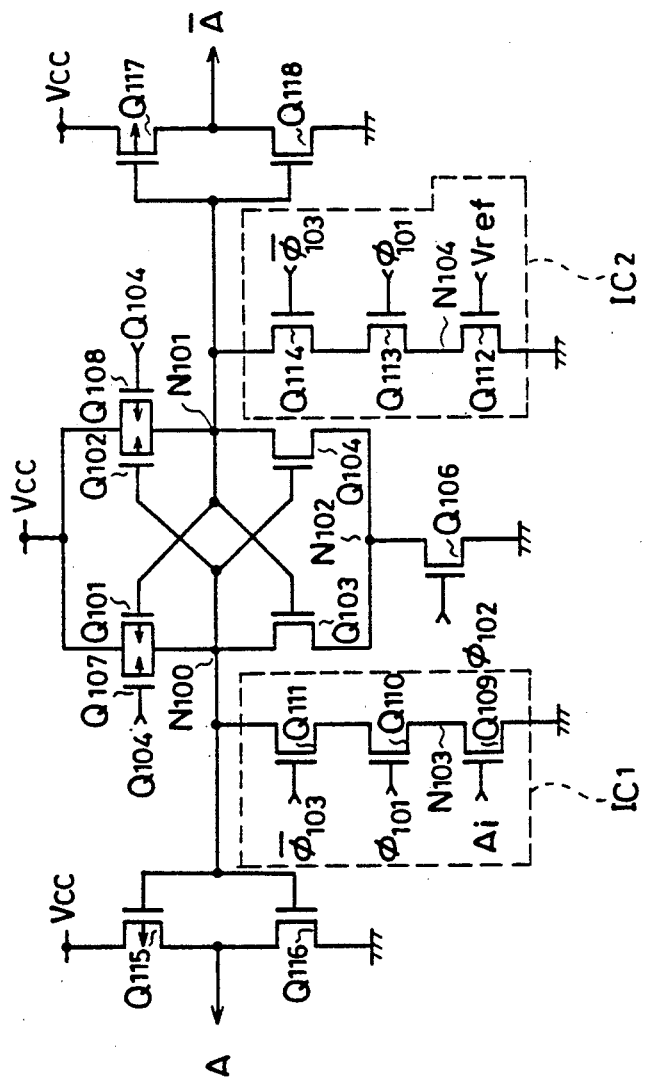
FIG. 4 is a circuit diagram showing a buffer circuit according to the second embodiment of the present invention.

FIG. 4 is a circuit diagram showing a buffer circuit according to the second embodiment of the present invention. A structure and an operation of the buffer circuit shown in FIG. 4 are the same as those of the buffer circuit shown in FIG. 1 except for the following. More specifically, the flip-flop circuit is driven by the inverter comprising the transistors $Q_{105}$ and $Q_{106}$ in the buffer circuit shown in FIG. 1, while a flip-flop circuit is driven by a single transistor $Q_{106}$ in the buffer circuit shown in FIG. 4. Thus, the node $N_{102}$ is precharged at the power-supply potential Vcc through the transistor $Q_{105}$ in the buffer circuit shown in FIG. 1, while a node $N_{102}$ is precharged at Vcc−$V_{TH}$ (where $V_{TH}$ is a threshold voltage of a transistor $Q_{103}$ or $Q_{104}$) in the buffer circuit shown in FIG. 4. The same effect as that of the buffer circuit shown in FIG. 1 can be obtained while simplifying the structure of the buffer circuit shown in FIG. 4.

Although in the above described embodiments shown in FIGS. 1 and 4, the input nodes $N_{100}$ and $N_{101}$ of the flip-flop circuit are precharged at the "H" level and each of the input circuits $IC_1$ and $IC_2$ comprises n channel transistors, the input nodes of the flip-flop circuit may be precharged at the "L" level and each of the input circuits may comprise p channel transistors, to obtain the same effect.

Figure 5:
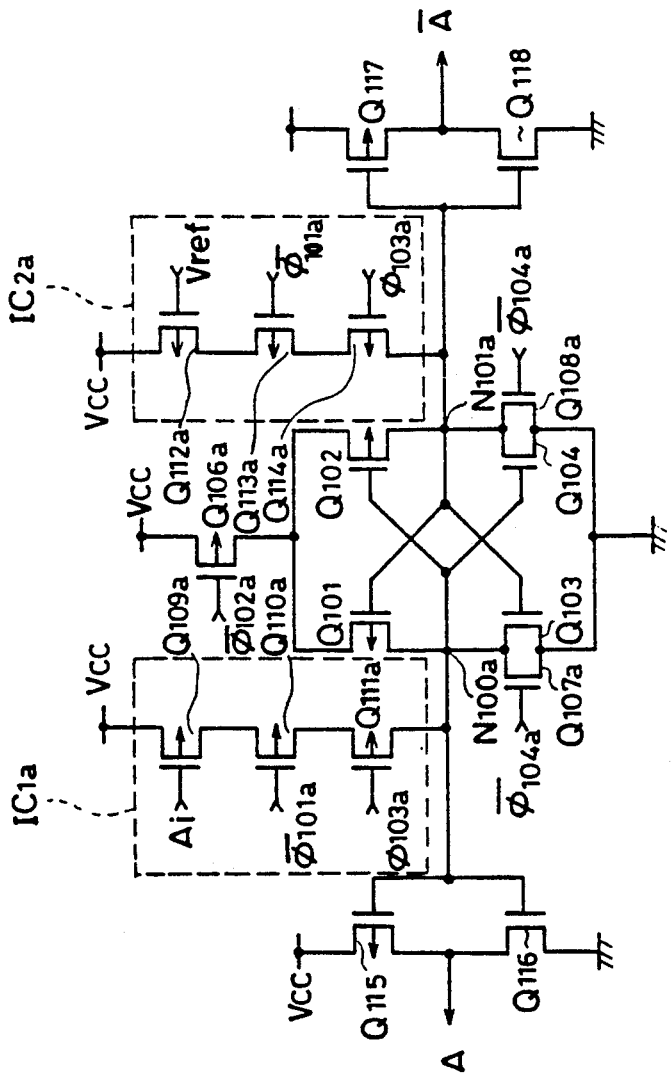
FIG. 5 is a circuit diagram showing a buffer circuit according to the third embodiment of the present invention.

FIG. 5 is a circuit diagram showing a buffer circuit according to the third embodiment of the present invention, in which each of input circuit of the flip-flop circuits comprises p channel transistors as described above. More specifically, a buffer circuit shown in FIG. is the same as the buffer circuits shown in FIGS. 1 and except that an input circuit $IC_1$a comprises p channel transistors $Q_{109}$a, $Q_{110}$a, and $Q_{111}$a, an input circuit $IC_2$a comprises p channel transistors $Q_{112}$a, $Q_{113}$a and $Q_{114}$a, a transistors for precharging comprises n channel transistors $Q_{107}$a and $Q_{108}$a, and a transistor for driving a flip-flop circuit comprises a p channel transistor $Q_{106}$a. In addition, FIG. 6 is a timing chart for explaining an operation of the buffer circuit shown in FIG. 5. As compared with the timing chart of FIG. 3, the polarity of each clock signal is reversed. However, the basic operation of the buffer circuit shown in FIG. 5 is the same as those of the buffer circuits shown in FIGS. 1 and 4.

Figure 7:
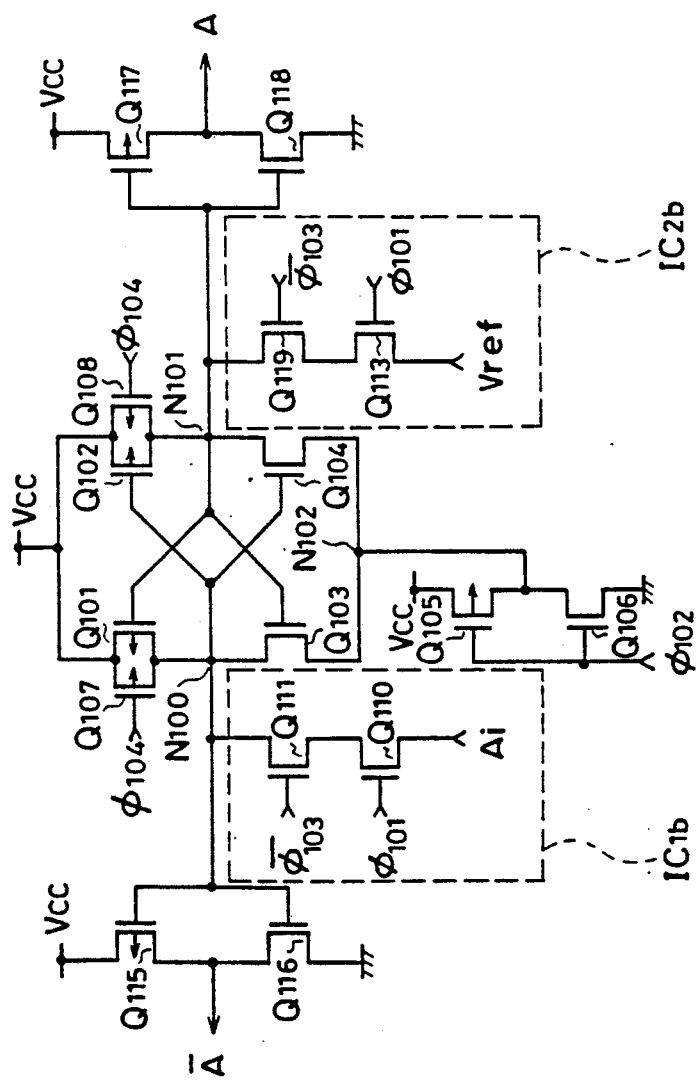
FIG. 7 is a circuit diagram showing a buffer circuit according to the fourth embodiment of the present invention.

FIG. 7 is a circuit diagram showing a buffer circuit according to the fourth embodiment of the present invention. A structure and an operation of the buffer circuit shown in FIG. 7 are the same as those of the buffer circuit shown in FIG. 1 except for the following. More specifically, the external address signal Ai and the reference potential Vref are applied to the gates of the transistors $Q_{109}$ and $Q_{112}$, respectively, in the buffer circuit shown in FIG. 1, while they are applied to the sources or drains of the transistors $Q_{110}$ and $Q_{113}$ in the buffer circuit shown in FIG. 7. Accordingly, the potential of the external address Ai is directly transmitted to the node $N_{100}$, while the reference potential Vref is directly transmitted to the node $N_{101}$ in the buffer circuit shown in FIG. 7. As a result, it should be noted that the relation between the output signals A and $\overline{A}$ to be extracted is the reverse of that of the buffer circuit shown in FIG. 1. Thus, the same effect as that of the buffer circuit shown in FIG. 1 can be obtained while simplifying the structure of the buffer circuit.

FIG. 8 is a circuit diagram showing a buffer circuit according to the fifth embodiment of the present invention, and FIG. 9 is a timing chart for explaining an operation of the buffer circuit shown in FIG. 8. A structure and an operation of the buffer circuit shown in FIG. 8 are the same as those of the buffer circuit shown in FIG. 1 except for the following. More specifically, each of the input circuits $IC_1$ and $IC_2$ is comprised of three n channel transistors in the buffer circuit shown in FIG. 1, while each of input circuits $IC_{1C}$ and $IC_{2C}$ is comprised of a p channel transistor $Q_{111C}$ or $Q_{114C}$) and two n channel transistors in the buffer circuit shown in FIG. 8. In such a case, however, it should be noted that, as shown in FIG. 9, the polarity of the signal $\overline{\phi}_{103C}$ to be applied to the gates of the p channel transistors $Q_{111C}$ and $Q_{114C}$ in FIG. 8 are the reverse of the potential of the signal $\phi_{103}$ to be applied to the gates of the n channel transistors $Q_{111}$ and $Q_{114}$ in FIG. 1.

Although in the above described embodiments shown in FIGS. 1, 4, 5, 7 and 8, description was made of a case in which a buffer circuit is applied to a row address buffer in a dynamic RAM, the buffer circuit may be used as another buffer circuit in the dynamic RAM or a buffer circuit in another memory device such as a static RAM, to obtain the same effect. Furthermore, in general, the buffer circuit may be applied to a data-in buffer receiving internally applied data for converting the level of the data or shaping the waveform of the data to output signals in phase and out of phase with the data to the inside of the circuit, to obtain the same effect.

Figure 10:
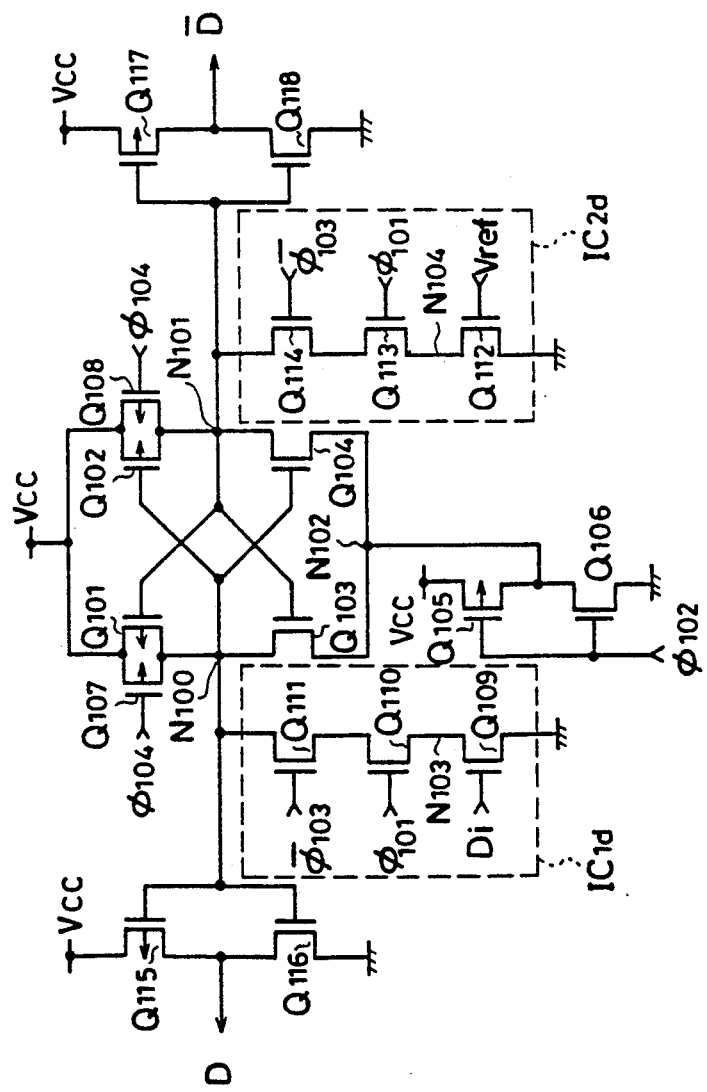
FIG. 10 is a circuit diagram showing a buffer circuit according to the sixth embodiment of the present invention.

FIG. 10 is a circuit diagram showing a buffer circuit according to the sixth embodiment of the present invention, wherein the buffer circuit of the present invention is used as a data buffer circuit, rather than the address buffer circuit. More specifically, a structure and an operation of the data buffer circuit shown in FIG. 10 is basically the same as those of the address buffer circuit shown in FIG. 1 except that a data input signal Di is applied to the input circuit instead of the external address signal Ai.

FIG. 11 is a circuit diagram showing a buffer circuit according to the seventh embodiment of the present invention, wherein the present invention is applied to a buffer circuit which is comprised of an inverter instead of a flip-flop circuit, and FIG. 12 is a timing chart for explaining an operation of the buffer circuit shown in FIG. 11. More specifically, in the buffer circuit shown in FIG. 1, signals A and $\overline{A}$ are outputted from the inverter circuit Ie, which signals are at the "H" level and the "L" level, respectively, in the initial state. When the signal $\phi_{101e}$ becomes "H" level so that the external address signal Ai is transmitted to the inverter Ie, the inverter Ie outputs the signal A and $\overline{A}$ in response to the level of the signal Ai.

FIG. 12 is a circuit diagram showing the eighth embodiment of the present invention, wherein the present invention is applied to a sense amplifier circuit, and FIG. 14 is a timing chart for explaining an operation of the sense amplifier circuit shown in FIG. 13. In FIG. 13, a bit line BLi is connected to a node $N_{100f}$ through n channel transistors $Q_{110f}$ and $Q_{111f}$, while a bit line $\overline{BLi}$ is connected to a node $N_{101f}$ through n channel transistors $Q_{113f}$ and $Q_{114f}$. The potentials at the nodes $N_{100f}$ and $N_{101f}$ are held at $(\frac{1}{2}) \cdot Vcc$ by a circuit not shown during a precharge period as shown in FIG. 14. When the signal $\phi_{101f}$ becomes the "H" level, the potentials at the bit lines BLi and $\overline{BLi}$ are transmitted to the nodes $N_{100f}$ and $N_{101f}$, respectively. Then, it is assumed that the data at the "H" level is being read out from a memory cell (not shown) onto the bit line BLi. In such a case, when the signals $\phi_{102f}$ and $\phi_{105f}$ become the "H" level and the "L" level, respectively, the sense amplifier is activated to amplify the potential difference between the bit lines, so that the potentials at the nodes $N_{100f}$ and $N_{101f}$ become the "H" level and the "L" level, respectively.

As described in the foregoing, according to the present invention, current through the flip-flop circuit can be decreased and the operating speed of the flip-flop circuit is improved. In addition, if the buffer circuit is employed as an address buffer circuit in a memory device, large margins can be provided for address set up time and address hold time.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device having an input circuit coupled to an input node of a logic circuit, comprising:
    input means for providing an input signal in response to a signal externally applied to said semiconductor device, to be coupled to said logic circuit,
    first and second transistors connected in series between a first terminal and a second terminal, said first terminal being connected to said input means and said second terminal being directly connected to said logic circuit input node,
    first clock signal generator means for applying a first clock signal to a control electrode of said first transistor at a first time to render said first transistor conductive,
    second clock signal generator means for applying a second clock signal to said second transistor at a second time, subsequent to said first time, to render said second transistor non-conductive,
    wherein said input signal is applied from said input means to said logic circuit input node through the first and second transistors during the time interval between said first time and said second time.

2. The input circuit according to claim 1, wherein the conductivity types of said first and second transistors are the same.

3. The input circuit according to claim 1, wherein the conductivity types of said first and second transistors are different from each other.

4. The input circuit according to claim 1, wherein said input means comprises a third transistor having its conductive path connected between said first terminal and a predetermined voltage source and a control electrode receiving said input signal for said logic circuit.

5. The input circuit according to claim 1, wherein said logic circuit comprises a flip-flop circuit.

6. The input circuit according to claim 1, wherein said logic circuit comprises an inverter circuit.

7. The input circuit according to claim 1, wherein said logic circuit is an address buffer circuit.

8. The input circuit according to claim 1, wherein said logic circuit is a data buffer circuit.

9. The input circuit according to claim 1, wherein said logic circuit is a sense amplifier circuit.

10. A differential input circuit for a logic circuit having first and second input nodes, comprising:
    a first transistor pair;
    first input means for applying, to a control electrode of each transistor of said first transistor pair, a first waveform transient for rendering said first transistor pair conductive;
    a second transistor pair, including transistors respectively connected in series with respective ones of said first transistors pair between respective first and second terminals;
    second input means for applying, to a control electrode of each transistor of said second transistor pair, a second waveform transient for rendering said second transistor pair non-conductive at a time subsequent to application of said first waveform transient;
    third input means for receiving a first input signal for said logic circuit and coupled to one of said respective first terminals, and
    fourth input means for receiving a second input signal for said logic circuit and coupled to the other of said respective first terminals;
    each of said respective second terminals coupled to a respective input node of said logic circuit
    whereby said first and second input signals for said logic circuit may be applied to said logic circuit for a period substantially equal to a timing interval between said first waveform transient and said second waveform transient.

11. The input circuit according to claim 10, wherein the conductivity types of said first and second transistor pairs are the same.

12. The input circuit according to claim 10, wherein the conductivity types of said first and second transistor pairs are different from each other.

13. The input circuit according to claim 10, wherein said third input means comprises a third transistor having its conductive path connected between one of said first terminal of said first series connection and a predetermined voltage source and a control electrode receiving said first input signal for said logic circuit, and said fourth input means comprises a fourth transistor, having its conductive path connected between the other of said first terminal and said predetermined voltage source, and a control electrode receiving said second input signal for said logic circuit.

14. The input circuit according to claim 10, wherein said logic circuit comprises a flip-flop circuit.

15. The input circuit according to claim 10, wherein said logic circuit comprises an inverter circuit.

16. The input circuit according to claim 10, wherein said logic circuit is an address buffer circuit.

17. The input circuit according to claim 10, wherein said logic circuit is a data buffer circuit.

18. The input circuit according to claim 10, wherein said logic circuit is a sense amplifier circuit.

19. A buffer circuit receiving an external signal for outputting true and complement signals, comprising:
flip-flop means connected between a first potential and a second potential and including first and second input nodes,
means for driving said flip-flop means upon receipt of a first clock signal,
first input circuit means comprising first, second and third switching devices connected in series between said first potential and said first input node,
second input circuit means comprising fourth, fifth and sixth switching devices connected in series between said first potential and said second input node,
means for supplying said external signal to a control terminal of said first switching device directly connected to said first potential,
means for applying a reference potential to a control terminal of said fourth switching device directly connected to said first potential,
means for applying a second clock signal to control terminals of said second and fifth switching devices for activating said first and second input circuit means,
means for applying a third clock signal to control terminals of said third and sixth switching devices for deactivating said first and second input circuit means,
means for extracting the true signal from said first input node, and
means for extracting the complement signal from said second input node.

20. The buffer circuit according to claim 19, which further comprises means for setting the timing of said first clock signal later than the timing of said second clock signal, and setting the timing of said third clock signal later than the timing of said first clock signal.

21. The buffer circuit according to claim 19, wherein said means for driving said flip-flop means comprises inverter means for inverting said first clock signal to apply the same to said flip-flop means.

22. The buffer circuit according to claim 19, wherein said means for driving said flip-flop means comprises a seventh switching device having a conductive path connected between said first potential and said flip-flop means and a control terminal receiving said first clock signal.

23. The buffer circuit according to claim 19, wherein said first potential is a ground potential, and said second potential is a predetermined power-supply potential.

24. The buffer circuit according to claim 19, wherein said first potential is a predetermined power-supply potential, and said second potential is a ground potential.

25. A method of operating a buffer circuit receiving an external signal for outputting true and complement signals, comprising means for supplying a first potential; means for supplying a second potential; flip-flop means having first and second input nodes and connected between said first and second potentials; first input circuit means comprising first, second and third switching devices connected in series between said first potential and said first input node; second input circuit means comprising fourth, fifth and sixth switching devices connected in series between said first potential and said second input node; means for supplying said external signal to a control terminal of said first switching device directly connected to said first potential; means for generating a reference potential to supply the same to a control terminal of said fourth switching device directly connected to said first potential; means for extracting the true signal from said first input node; and means for extracting the complement signal from said second input node, which comprises:
a first step of controlling said second and fifth switching devices to bring said first and second input circuit means into the operating state,
a second step of driving said flip-flop means, and
a third step of controlling said third and sixth switching devices to bring said first and second input circuit means into the non-operating state.

26. The method according to claim 25, wherein said first step comprises the steps of
rendering said third and sixth switching devices conductive in advance, and
then applying a clock signal to control terminals of said second and fifth switching devices to be rendered conductive.

27. The method according to claim 25, wherein said first potential is a ground potential, said second potential is a predetermined power-supply potential.

28. The method according to claim 25, wherein said first potential is a predetermined power-supply potential, and said second potential is a ground potential.

29. A address buffer circuit receiving an external address signal for outputting true and complement signals, comprising:
logic circuit means having first and second input nodes,
a first transistor pair;
first input means for applying, to a control electrode of each transistor of said first transistor pair, a first waveform transient for rendering said first transistor pair conductive;
a second transistor pair, respectively connected in series with respective ones of said first transistor pair between respective first and second terminals;
second input means for applying, to a control electrode of each transistor of said second transistor pair, a second waveform transient for rendering said second transistor pair non-conductive at a time for subsequent to application of said first waveform transient;

third input means for receiving said external address signal and coupled to one of said respective first terminals, and fourth input means for receiving a reference potential and coupled to the other of said respective first terminals;

each of said respective second terminals coupled to a respective input node of said logic circuit;

means for extracting the true signal from said first input node, and means for extracting the complement signal from said second input node whereby said external address signal and said reference potential may be applied to said logic circuit means for a period substantially equal to a timing interval between said first waveform transient and said second waveform transient.

* * * * *